United States Patent [19]

Smith

[11] 4,441,068
[45] Apr. 3, 1984

[54] BIPOLAR LINEAR CURRENT SOURCE DRIVER AMPLIFIER FOR SWITCHING LOADS

[75] Inventor: James F. Smith, Smithtown, N.Y.

[73] Assignee: Kollmorgen Technologies Corporation, Dallas, Tex.

[21] Appl. No.: 314,010

[22] Filed: Oct. 22, 1981

[51] Int. Cl.$^3$ ............................................. G05F 1/56
[52] U.S. Cl. .................................. 323/351; 307/270; 318/139
[58] Field of Search ............... 323/272, 282, 289, 351; 363/124; 318/341, 139; 307/240, 270

[56] References Cited

U.S. PATENT DOCUMENTS

| | | | |
|---|---|---|---|
| 4,027,228 | 5/1977 | Collins | 323/289 |
| 4,234,805 | 11/1980 | Carlsen | 307/270 |
| 4,291,259 | 9/1981 | Marumoto et al. | 323/272 |
| 4,300,081 | 11/1981 | Van Landingham | 318/341 |
| 4,345,164 | 8/1982 | Gies | 307/270 |

FOREIGN PATENT DOCUMENTS

1315660  5/1973  United Kingdom ................ 323/282

Primary Examiner—William H. Beha, Jr.
Attorney, Agent, or Firm—Morgan, Finnegan, Pine, Foley & Lee

[57] ABSTRACT

A circuit for driving an electrical load such as an electric motor, by a pulse width modulated current includes a saturable current driver connected to the load. The circuit includes a linear transconductance amplifier with current-sensing feedback for applying a pulse-width modulated control current to the driver. The feedback preserves the extent of saturation and of cut-off by providing current pulses which are invariant with respect to thermally induced changes in circuit parameters. Amplitude and offset control circuitry are also provided for setting the range of current values during the current pulsing to optimize the operation of the driver. In an alternative simplified circuit, a low-level switching circuit drives complementary output transistors operating in a linear fashion, and producing current pulses which are invariant with respect to the saturable driver parameters.

15 Claims, 6 Drawing Figures

BIPOLAR LINEAR CURRENT SOURCE DRIVER AMPLIFIER FOR SWITCHING LOADS

BACKGROUND OF INVENTION

This invention relates to electrical amplifiers, and, more particularly, to a linear current amplifier for amplifying a square wave signal to drive a nonlinear load having a saturable amplifier stage.

Amplifiers for driving a load, such as an electric motor, frequently employ transistor amplifying stages driven between states of saturation or current conduction and cut-off or current nonconduction. The power applied to the load is sufficiently high such that, if a comparable amount of power were dissipated in the transistor amplifier stage immediately preceding the load, the transistor amplifier stage would overheat and fail. During a state of saturation and during a state of nonconduction, minimal power is dissipated in a transistor. Thereby, amplifiers employing transistors operating in the switch mode, switching between states of saturation and nonconduction, can apply the high power to the load without the dissipation of excess heat in the transistor.

The resulting signal applied to the load, thus, has the waveform of a square wave or digitally formatted signal. The amplitudes of the pulses of the succession of pulses of the signal are all equal. Variation of the power applied to the load is accomplished by pulse-width modulation of the square-wave signal to provide a duty cycle commensurate with the desired power which is to be applied to the load. A system for applying power to a load typically comprises in addition to the amplifier, an oscillator generating a square-wave signal, a source of an analog signal having an amplitude designating the requisite duty cycle, and a pulsewidth modulator which is responsive to the analog signal for modulating the duration of the pulses of the square wave signal to provide the requisite duty cycle. The pulse repetition frequency of the signal applied to the load is much higher than the frequency response of the load circuits, namely, the cut-off frequency of the inductive circuit of a motor or the cut-off frequency of the capacitive circuit in a capacitive type load. Thus, the load filters the pulse-train signal to extract a current or voltage equal to the average value thereof. Since the average value is proportional to the duty cycle, the load receives the desired power.

To conserve power in the entire amplifier, other stages, in addition to the stage immediately preceding the load, have been constructed of transistor circuits wherein the transistor is switched between states of saturation and nonconduction. Thus, such amplifiers have been constructed of serially connected transistors operating in the switch mode. Such circuitry has been advantageous in reducing the power dissipation requirements of the transistors and, thereby, permits the use of more economical lower-power transistors.

However, a number of irregularities arise in the use of a series of switch-mode transistor circuits for driving the switch-mode transistor immediately preceding the load, as well as for driving other nonlinear circuits.

A problem arises from the use of a series of switch-mode transistors with current limiting resistors to provide driving current to the transistor amplifying stage immediately preceding the load. A switched-mode transistor amplifying stage, as an example of a saturable driver immediately preceding the load, requires a positive base current to flow in order to induce and sustain saturation. The magnitude of this positive base current must be a dictated percentage of the desired collector current in the saturable transistor driver stage in order to insure efficient switched-mode operation. The simple use of current limiting resistors precludes the possibility of accurate control of the saturating driver transistor with respect to changing driver conditions, wherein these conditions include, but are not limited to, changes in driver temperature, changes in collector current, voltage fluctuations and emmiter ballast resistor voltage drops under parallel driver operation.

A problem arises from the failure of a series of switch-mode transistor circuits to preserve the rise time and fall time, respectively, at the leading and trailing edges of each pulse of the modulated square-wave signal. As a result, the rise and fall times become progressively longer during each amplifying stage, and the square-wave signal is thus modified to a trapezoidal signal. Thus the amplifying stage preceding the load experiences periods of time when the transistor therein is neither in a state of saturation or a state of non-conduction. Excessive heating results, defeating the purpose of the switch-mode operation. Attempts to remedy the situation by use of more rapidly responding transistors which can better preserve the rise and fall times may well be impractical because of their relatively high cost.

SUMMARY OF THE INVENTION

The aforementioned problems are overcome and other advantages are provided, in accordance with the invention, by a system incorporating a linear driver and a nonlinear driver. The linear driver activates the nonlinear driver to power a load. Typically, the nonlinear driver comprises a transistor operating in a switch mode between states of saturation and non-conduction; however, the driver may comprise another component operating in a nonlinear fashion such as a magnetic amplifier employing a saturable reactor core. Both the linear and non-linear drivers are operated in response to a drive signal having a square waveform which is pulse-width modulated. The amplitude of the drive signal is provided with a predetermined magnitude as is required to induce a corresponding state of saturation, such as incipient, moderate or deep saturation, in the nonlinear driver.

For example, in the case of a transistor, incipient saturation designates the portion of the operating characteristic wherein the forced gain of the transistor is reduced, but wherein the base current is still sufficiently small so as not to introduce a substantial change in the effective capacitance of the base-emitter junction. Thus little voltage appears across the emitter-collector terminal pair, and little power is dissipated within the transistor. Also, no more than minimal change occurs in the response time of the transistor. In contrast, with deep saturation, there is substantial charge stored in the base-emitter junction with a corresponding increase in the capacitance of the junction and a decrease in the frequency response of the transistor. The state of incipient saturation requires accurate control of base current since, upon a reduction of the base current, the saturation is no longer present and, upon an increase in the base current, moderate to deep saturation occurs.

In the preferred embodiment of the invention, the nonlinear driver incorporates a transistor which is operated in the switch mode between states of incipient saturation and nonconduction. The linear driver provides a pulse train signal which is pulse-width modulated to have an average value proportional to the amplitude of a control signal which designates the amount of power to be applied to the load. The output terminal of the linear driver is coupled to the base terminal of the transistor for applying base current thereto. Initiation of a pulse of the base current produces a state of saturation in the transistor. Termination of the current pulse results in a state of nonconduction in the transistor.

In accordance with the invention, the linear driver includes a feedback transconductance amplifier wherein a measure of the output current is fed back and summed with an input voltage signal to insure that the base current applied to the transistor has an amplitude directly proportional to the amplitude of the input signal. The input signal has a square waveform which is pulse-width modulated. The current applied to the base terminal has a square waveform with the identical pulse-width modulation. The linear amplifier is provided with an output stage symmetrically coupled between positive and negative sources of voltage to have the capability for supplying both positive and negative values of current to drive both PNP and NPN transistors, the sense of the current depending on the sense of the input drive voltage. Advantageously, circuitry is included for the magnitude of the current pulses and for adjusting the amplitude of the current between pulses so as to accurately control the states of saturation and nonconduction. Thereby, the duty cycle, the waveform, and the amplitude of the base current are precisely controlled independently of any effects associated with the states of saturation or nonconduction of the transistor.

In accordance with an important aspect of the invention, the linear driver is provided with sufficient bandwidth and power to replicate the rise and fall times of each pulse of the pulse-width modulated waveform. The replicated rise and fall times appear in the current pulses of the control signal applied to the switch-mode transistor of the nonlinear driver. Thereby, in the switch-mode transistor, the transitions between states of saturation and nonconduction are made precisely for effecting the desired average power level, and with sufficient rapidity to avoid excessive heating of the transistor. The use of the linear driver, in lieu of a series circuit of saturating transistor drivers, has thus overcome the problems of heating and waveform distortion associated with such a series circuit of saturating drivers.

To still further improve the base-current waveform for a further reduction in the turn-on and turn-off times of the saturation current in the transistor, a pulse shaper is advantageously placed ahead of the transconductance amplifier to insert a leading edge spike at the beginning of each saturation interval and each nonconduction interval. The resulting spikes in the base-current overcome effects of capacitance and charge storage in the transistor to accomplish the more rapid transitions in state between the states of saturation and nonconduction.

While the circuitry set forth in the foregoing description is advantageously employed for driving a variety of loads having differing electrical characteristics, a simplification of the circuitry can be employed when the circuitry is to be utilized for driving only a load having a single set of predetermined electrical characteristics. For example, when the current, voltage and impedance of the load are preset, and it is not planned to employ the foregoing circuitry for driving some other load, then the great facility of the foregoing circuitry for applying differing magnitudes of current to loads of differing impedances is not required. Accordingly, a large portion of the foregoing circuitry can be replaced by a less costly circuit having substantially fewer electrical components. The alternative simplified circuit employs a complementary transistor drive circuit wherein base current is applied by a pair of zener diodes and an electronic switching circuit. The switching circuit activates the complementary drive circuit to provide alternately positive and negative pulses of current to the nonlinear driver. Thereby, feedback circuitry and pulse shaping circuitry of the aforementioned embodiment can be deleted with a substantial saving in electronic complexity and in cost.

BRIEF DESCRIPTION OF THE DRAWINGS

The aforementioned aspects and other features of the invention are explained in the following description taken in connection with the accompanying drawings wherein.

DESCRIPTION OF THE PREFERRED EMBODIMENT

Figure 1:
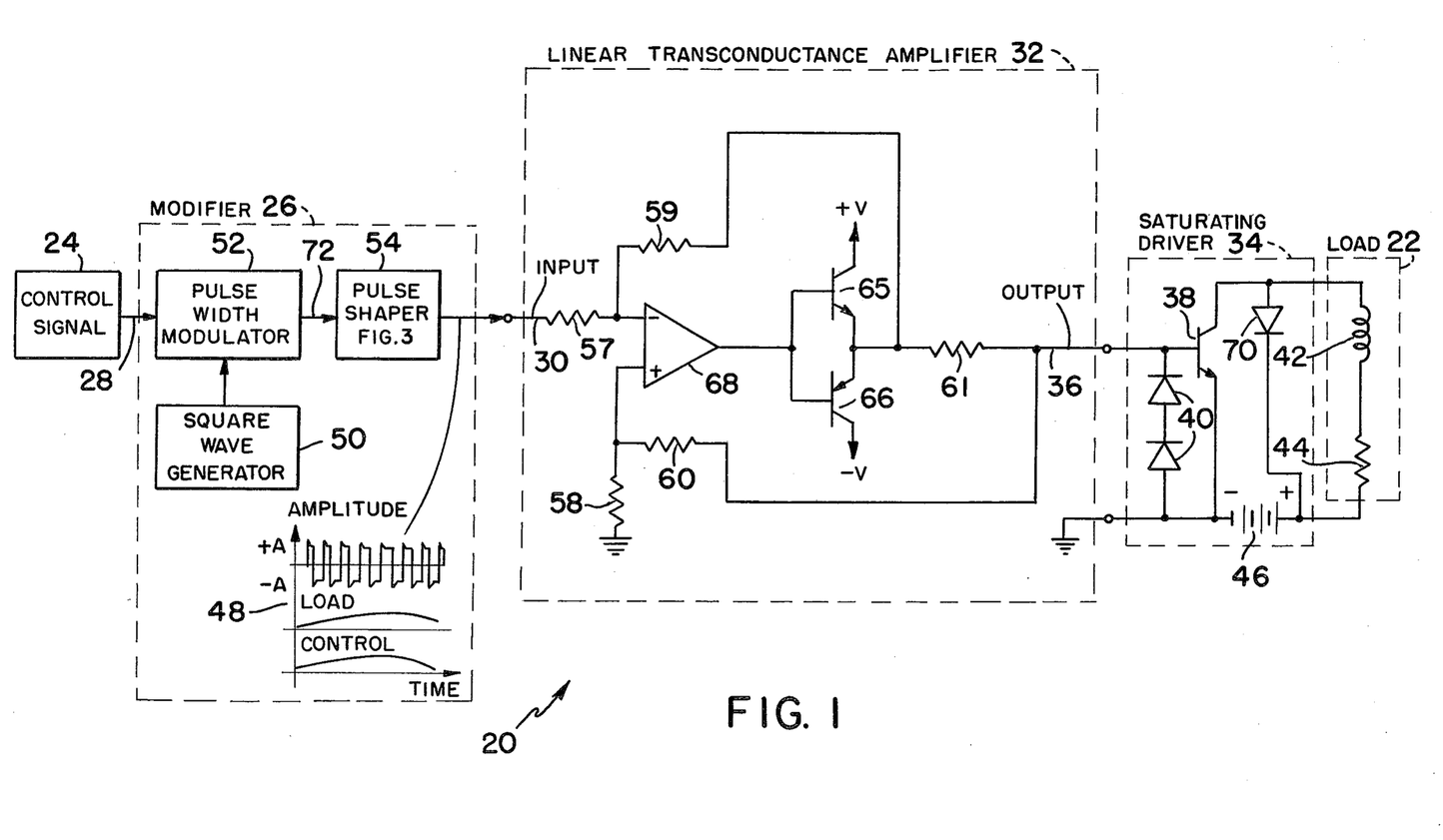
FIG. 1 is a schematic drawing, partially in block diagrammatic form, of a system incorporating the invention.

Referring now to FIG. 1, there is shown a system 20 for applying electrical power to a load 22 in accordance with a control signal from a signal source 24. In accordance with the invention, the system 20 comprises a signal modifier 26 for modifying the format of an analog signal on line 28 from the source 24 to a pulse-width modulated signal on line 30. The system 20 further comprises a linear transconductance amplifier 32 and a saturable driver 34 which couple pulse-width modulated signals from the modifier 26 to the load 22.

In accordance with a feature of the invention, a driver 34 is operated in a non-linear mode while the amplifier 32 provides a linear relationship between the magnitude of the output current thereof on line 36 and the magnitude of the input voltage to the amplifier 32 on line 30. By way of example, the driver 34 is shown with an exemplary circuit comprising a transistor 38 and a pair of diodes 40 which are serially connected across the base-emitter junction of the transistor 38, and are poled in the sense opposite that of the base-emitter junction. Current pulses of the pulse-width modulated signal on line 36 are applied as a base drive to the transistor 38. Upon each occurrence of a current pulse on line 36, the transistor 38 enters a stage of saturation. Upon termination of each current pulse on line 36, the transistor 38 is cut off to be in a state of nonconduction. Thereby, minimal power is dissipated within the transistor 38 while a maximum amount of power is coupled to the load 22. The load 22 is an exemplary stator winding of a motor, the winding being shown schematically as comprising an inductor 42 and a resistor 44 which are serially connected between the emitter and collector terminals of the transistor 38 by a source of electric power shown as battery 46. The linear operating characteristic of the amplifier 32 insures that the leading and trailing edges of the base current drive to the transistor 38 accurately follow the corresponding edges of the pulse signal on line 30. Thereby the transitions between the states of saturation and nonconduction occur rapidly for minimizing the power dissipated within the transistor 38.

With reference to a graph 48 shown within the block of the modifier 26, the upper trace thereof is appended to the line 30 and portrays the waveform of an exemplary pulse-width modulated signal. The second trace of the graph 48 portrays an idealized filtered waveform of the current flowing through the load 22, while the third trace shows the waveform of an exemplary control signal on line 28 from the source 24. By way of example, the source 24 includes a potentiometer (not shown) and a battery (not shown) whereby the analog voltage on line 28 can be manually varied in accordance with the waveform depicted in the third trace of the graph 48. In order to accomplish the filtering of the current pulses by the load 22, the repetition frequency of the pulse train upon line 30 is preferably made at least two or three times higher than the cut-off frequency of a filter of the load, the filter comprising the inductor 42 and the resistor 44. Thereby, the current flowing in the load 22 is proportional to the average value of a sequence of current pulses on the line 36 from the amplifier 32.

The modifier 26 comprises a square-wave generator 50 a pulse-width modulator 52, and a pulse shaper 54 for providing the pulse-width modulated signal on line 30 in response to the control signal on line 28. A generator 50 applies a sequence of square wave pulses of equal duration to the modulator 52. The modulator 52, in response to the voltage of the signal on line 28 varies the duration of the successively occurring pulses in proportion to the magnitude of the voltage on line 28. Thereby, the duty cycle of the pulse train signal at the output terminal of the modulator 52, as well as the duty cycle of the pulse train signal on line 30, is proportional to the voltage of the control signal on line 28. The shaper 54, as will be described subsequently with reference to FIG. 2, includes a limiter for setting the amplitude of the pulse train signal to a preset magnitude, and may also include circuitry for applying a leading-edge spike to each pulse for increasing the rate of transition between the states of saturation and nonconduction in the driver 34.

The amplifier 32 comprises five resistors 57-61, two transistors 65-66, and an operational amplifier 68. The resistor 57 couples the input signal on line 30 to the negative input terminal of the operational amplifier 68. The resistor 58 couples the positive input terminal of the amplifier 68 to ground. The input signal on line 30 varies between positive and negative voltages of equal amplitude, shown as +A and −A in graph 48, and the output current on line 36 similarly varies between equal peak values of positive and negative current. It is noted, in contradistinction, that the current flowing through the collector terminal of the transistor 38 in response to the current on line 36 is unidirectional only since the transistor 38 is cut off during the negative current flow in the line 36. The negative current flow is coupled from ground by the diode 40 into the line 36. The transistors 65 and 66 have their emitter terminals connected together for symmetrical power drive between the voltages +V and −V, the voltages being provided in a conventional manner. The output terminal of the amplifier 68 supplies base current to the transistors 65 and 66. The excursion in voltage at the output terminal of the amplifier 68, and the excursions in the values of current flowing through the transistors 65-66 are sufficiently small so that the amplifier 68 and the transistors 65-66 are operated only within their linear modes of operation.

A feature of the invention is found in the use of the two feedback resistors 59-60 which are coupled respectively to the negative and positive input terminals of the operational amplifier 68. The resistors 57-58 have equal values of resistance and, similarly, the resistors 59-60 have equal values of resistance. The voltage fed back by the resistor 59 from one terminal of the resistor 61 differs from the voltage fed back by the resistor 60 from the other terminal of the resistor 61 by a voltage different equal to the voltage drop across the resistor 61. The resistor 61 is of relatively small amplitude compared to the values of the resistors 57-60 so as to serve as a current measuring resistor wherein the voltage drop across the resistor 61 is proportional to the value of the current on line 36. The relatively large values of the resistors 59-60 insure that no more than a negligible amount of current in the line 36 is coupled back into the input terminal of the amplifier 68. The resistor 61, in series with the input impedance of the driver 34, serves as the emitter impedance for the emitter circuits of the transistors 65-66. In view of the coupling of the voltage drop across the resistor 61 to the differential input terminals of the amplifier 68, the output voltage of the amplifier is driven with such magnitude and sense to force the current on line 36 to precisely follow the waveform of the voltage signal on line 30 at the input terminal of the transconductance amplifier 32. Thus, the current on line 36 linearly follows the voltage waveform on line 30 for all values of the voltage on line 30, the linear relationship being insured by the aforementioned operation of the amplifier 68 and the transistors 65-66 within their linear ranges.

In contrast, the aforementioned nonlinear operation of the driver 34 provides for current flow in the collector circuit of the transistor 38 only during the periods of saturation of the transistor 38, the transistor 38 being cut off during the negative portions of the waveform in the first trace of the graph 48. During such periods of time when the transistor 38 is cut off, current flow through the inductor 42 is bypassed around the transistor 38 by a diode 70. The smoothed value of the load current, described previously with reference to the second trace of the graph 48, is thus seen to represent the average value of a sequence of positive portions, only, of the waveform of the first trace of the graph 48. By applying the base drive current to the transistor 38 by a linear amplifier, the amplifier 32, the successively occurring states of saturation of the transistor 38 are precisely controlled independently of temperature variations or voltage variation in the circuit of the driver 34.

Figure 2:
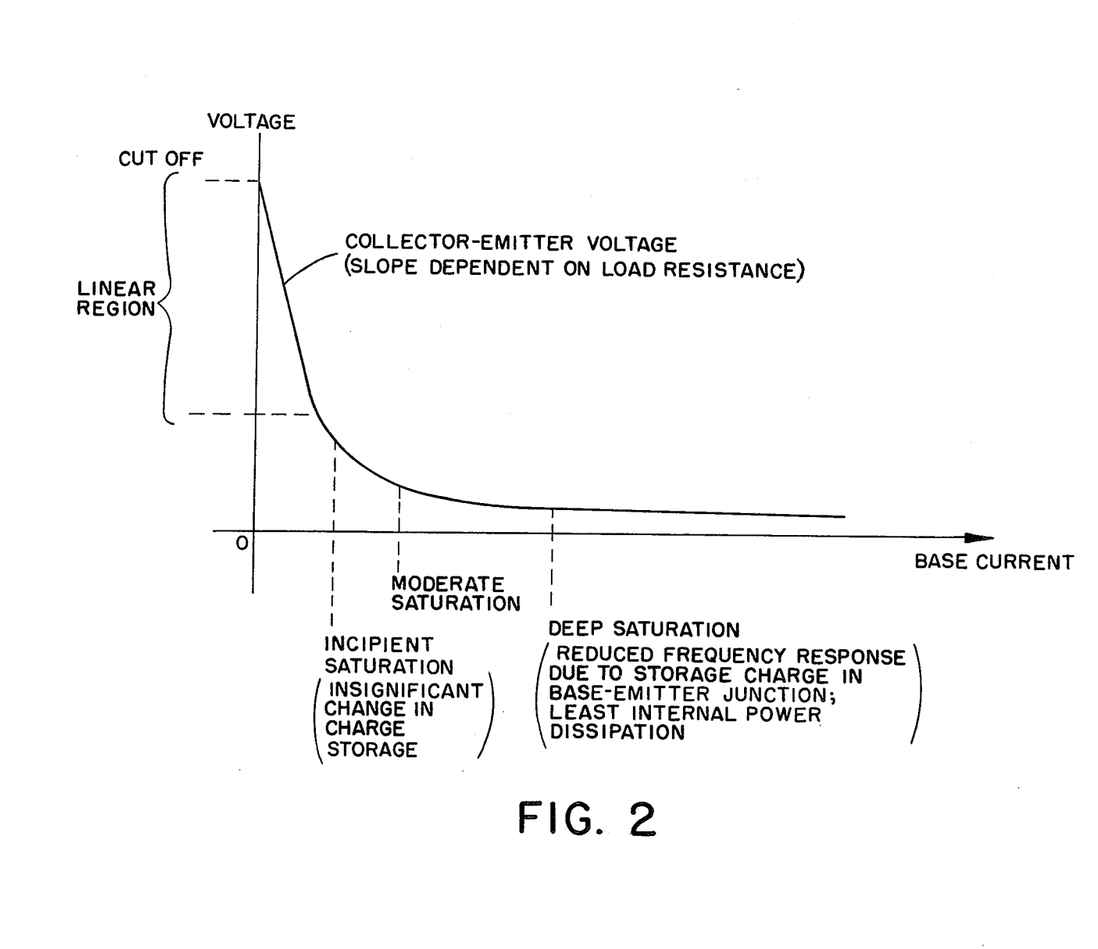
FIG. 2 is a stylized diagrammatic presentation of states of saturation of a transistor.

Referring to FIG. 2, the graph shows the relationship of voltage, across the collector-emitter terminal pair, and the state of saturation as a function of base current. In particular, it is noted that in the deep states of saturation, substantial changes in the magnitude of base current may occur without a significant change in the collector-emitter voltage. However, at incipient saturation a relatively small decrease in base current terminates the state of saturation, with a rapid increase in the collector-emitter voltage. Accordingly, the accurate current control provided by the transconductance amplifier is essential to the operation of the invention.

Figure 3:
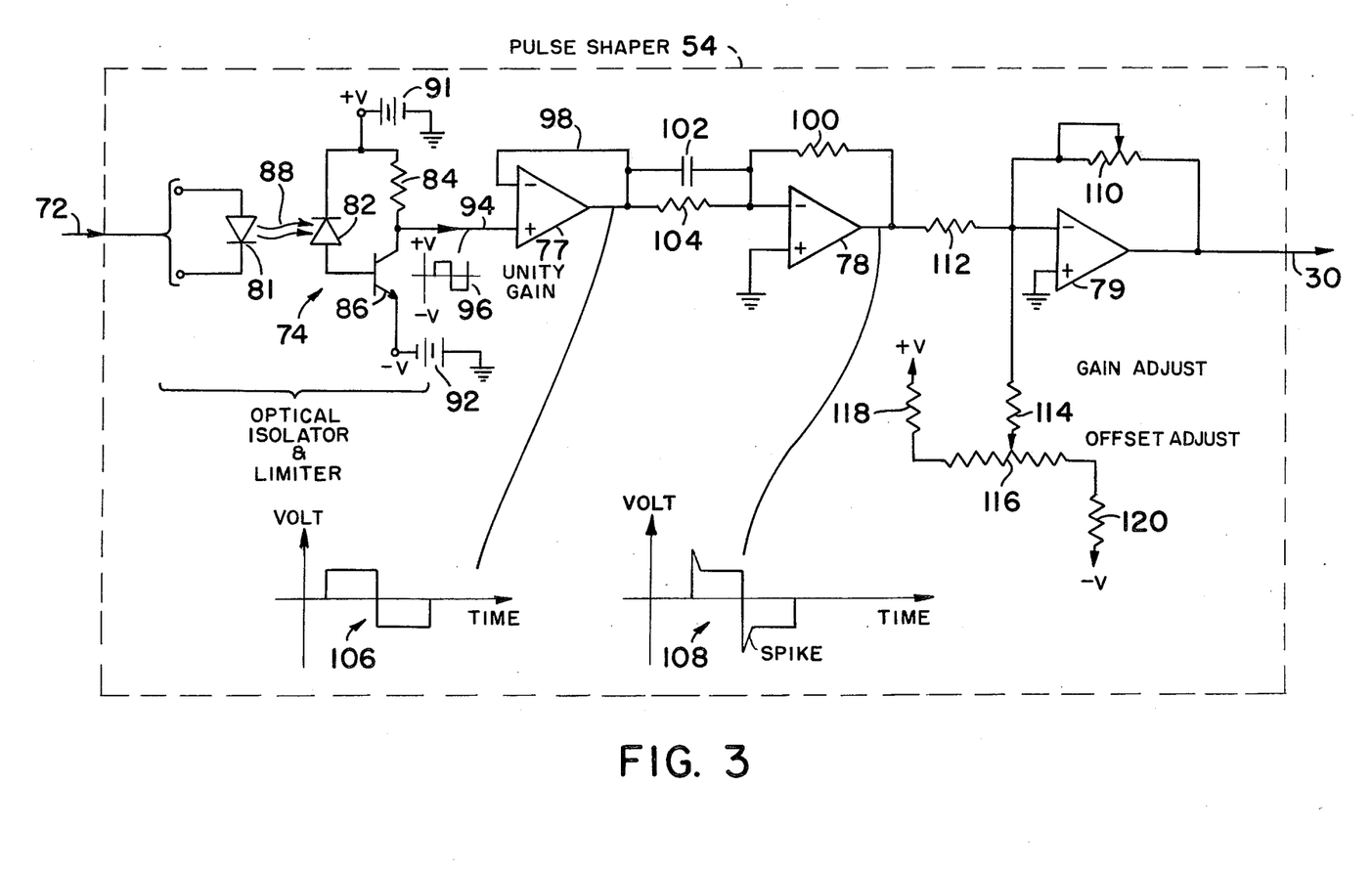
FIG. 3 is a schematic diagram of a pulse shaper of the system of FIG. 1.

Referring now to FIG. 3, the pulse shaper 54 receives the pulse-width modulated signal on line 72 from the modulator 52, and produces an output pulse-width modulated signal on line 30 as has been depicted in the graph 48 of FIG. 1. The shaper 54 permits adjustment of the amplitude of the pulse signal on line 30 to a predetermined magnitude while retaining the duty cycle of the pulse-width modulation. In addition, the shaper 54 provides a leading edge spike at the leading edge of each pulse on line 30 for improved operation of the driver 34 of FIG. 1.

The pulse shaper 54 comprises an optical isolator 74 and three operational amplifiers 77-79. The optical isolator 74 comprises two diodes 81-82, a resistor 84 and a transistor 86. The diodes 81-82 are photodiodes which are optically coupled by light rays 88, the diode 81 transmitting the light rays 88 in response to each occurrence of a positive pulse on line 72 while the diode 82 is responsive to each occurrence of the light rays 88 for applying base current to the transistor 86. The transistor 86 is energized by two voltage sources providing voltages of $+V$ and $-V$, the voltage sources being shown as exemplary batteries 91-92.

In operation, the isolator 74 produces a square-wave pulse signal on line 94 having the same duty cycle as the square-wave signal on line 72, the signal on line 94 being depicted in a graph 96 appended adjacent the line 94. Upon each occurrence of a pulse of light, the transistor 86 is driven into saturation with collector current in the transistor 86 flowing through the series circuit comprising the resistor 84 and the two batteries 91-92 which are coupled together by the ground terminal. Upon termination of the light pulse, the diode 82 terminates the flow of base current to the transistor 86 thereby placing the transistor 86 in a state of nonconduction. Accordingly, voltage at the collector terminal alternates between values of $+V$ and $-V$ relative to ground. As a result, the square wave signal on line 94 is limited in magnitude by the voltages of the battery 91-92. Thereby, the isolator 74 provides the dual functions of isolating voltage levels within the shaper 54 from voltage levels appearing in the modulator 52 while limiting the magnitudes of the positive and negative amplitudes of the square-wave signal on line 94.

The amplifier 77 is provided with unity gain by a feedback path 98, the construction of such unity gain amplifying stages being well known. Thereby, the amplifier 77 provides impedance isolation which preserves the waveform of the signal on line 94 while providing sufficient power to drive the succeeding stages of the shaper 54.

The amplifier 78 is provided with a feedback path in the form of a resistor 100 coupled between the output terminal of the amplifier 78 and the negative input terminal thereof. The negative input terminal of the amplifier 78 is coupled to the output terminal of the amplifier 77 by the parallel combination of a capacitor 102 and a resistor 104. The positive input terminal of the amplifier 78 is coupled to ground. The gain of the amplifier 78 is fixed in accordance with the ratio of the values of resistance of the resistors 100 and 104. The value of the capacitance of the capacitor 102 is selected such that the time constant produced by the capacitor 102 in combination with the resistors 104 and 100 is much smaller than the duration of a pulse of the square-wave signal on line 94. The effect of the capacitor 102 is to produce a momentary overshoot or "spike" at the leading edge of each positive pulse and at the leading edge of each negative pulse. The overshoot may be seen by reference to the graphs 106 and 108 appended, respectively, at the output terminals of the amplifiers 77 and 78. The waveform in the graph 108 shows the spike while, in the graph 106, the spikes are not present.

The amplifier 79 is provided with a feedback path in the form of a potentiometer 110 which is coupled between the output terminal of the amplifier 79 and the negative input terminal thereof. The negative input terminal of the amplifier 79 is coupled by a resistor 112 to the output terminal of the amplifier 78. An end terminal of the potentiometer 110 is connected to the sliding contact thereof for varying the amount of resistance in the feedback path. As is well known, the gain of the amplifier stage is dependent on the ratio of the feedback resistance provided by the potentiometer 110 to the resistance of the resistor 112. Thereby, the amplifier 79 is utilized as a variable gain stage of amplification wherein the desired magnitude of the pulse-width modulated signal on line 30 is set to a predetermined value by adjustment of the potentiometer 110. With reference also to FIG. 1, the magnitude of the signal on line 30 is selected in accordance with the current characteristics of the transistor 38 and the driver 34, a larger magnitude of the signal on line 30 being selected for transistors requiring a relatively high base current to induce saturation while a relatively small magnitude of the signal on line 30 is selected for transistors utilizing a relatively small base current during saturation.

In operation, therefore, the limiting action of the isolator 74 in combination with the gain selection of the amplifier 79 provide for the optimum magnitude of base current applied by the transconductance amplifier 32 (FIG. 1) to the transistor 78 for inducing the alternate states of saturation and nonconduction. The capacitor 102 preceding the amplifier 78 (FIG. 2) provides the voltage spikes at the leading edges of the pulses, the voltage spikes being converted by the transconductance amplifier 32 to current spikes which shorten the transition times between the states of saturation and nonconduction in the transistor 38. The waveform of the signal produced by the shaper 54 is preserved by the linearity of the amplifier 32 resulting in a maximum coupling of power from the nonlinear driver 34 through the load 22 while minimizing the amount of power dissipated in the driver 34.

The pulse shaper 54 is advantageously provided with circuitry for offsetting the value of the signal on line 30 during the intervals of time between successive ones of the pulses, this resulting in a corresponding offset in the current on line 36 (FIG. 1) at the output terminal of the amplifier 32. Thereby, current cut-off in the transistor collector circuit can be accomplished by applying zero current to the base terminal of the transistor 38. Alternatively, a relatively small value (as compared to the magnitude of the current pulse) of positive or negative current may be applied to the base terminal for terminating the flow of collector current, the value to be selected in accordance with the characteristics of the transistor being utilized in the driver 34.

The offset circuitry is implemented by summing an offset voltage via resistor 114 to the signal coupled via resistor 112 at the negative input terminal of the amplifier 79. The offset circuitry includes a potentiometer 116 connected in series with resistors 118 and 120 between the voltages +V and −V of the batteries 91–92. The resistor 114 connects with the center terminal of the potentiometer 116 so that, upon adjusting the potentiometer 116 to the desired offset, the resistor 114 combines the desired offset voltage with the signal voltage of the resistor 112. The transconductance amplifier 32 then converts the offset voltage to the desired value of base current for the transistor 38.

Figure 4:
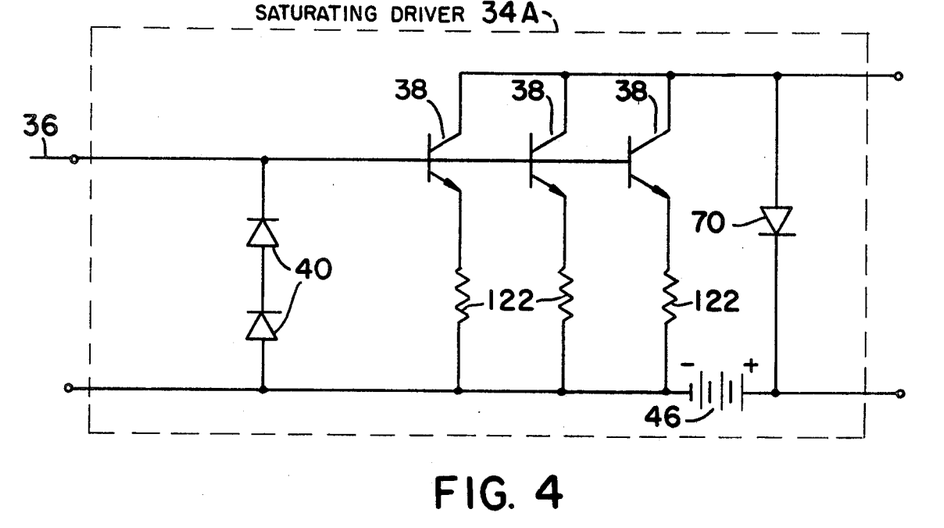
FIG. 4 is a schematic diagram of an alternative embodiment of a nonlinear driver of FIG. 1 showing transistors connected in a parallel circuit.

Referring to FIG. 4, there is shown a driver 34A which is an alternative embodiment to the driver 34 previously disclosed in FIG. 1. The driver 34A comprises a plurality of transistors connected in parallel, three transistors 38 being shown by way of example, with emitter resistors 122 coupled between respective one of the emitter terminals and the battery 46. The diodes 40 are coupled in series between the junction of the three base terminals and the negative terminal of the battery 46, and the diode 70 is coupled between the junction of the three collector terminals and the positive terminal of the battery 46, corresponding to the connections of the diodes 40 and 70 in FIG. 1. The operation of the driver 34A follows that of the driver 34. However, it should be noted that, due to the predetermined magnitude of the current pulses applied via line 36 from the amplifier 32, the transistors 38 are readily protected from excessive current in the event of a variation in the parameters among the respective ones of the transistors 38 by simply the resistors 122. The value of resistance is selected to approximately equal the value of the base-emitter resistance of a transistor, and provides voltage drop of approximately one-half volt across the resistors 122 during saturation of the transistors 38, the actual value of voltage varying among the transistors 38 in accordance with differences in their parameters so as to induce uniform states of saturation.

Figure 5:
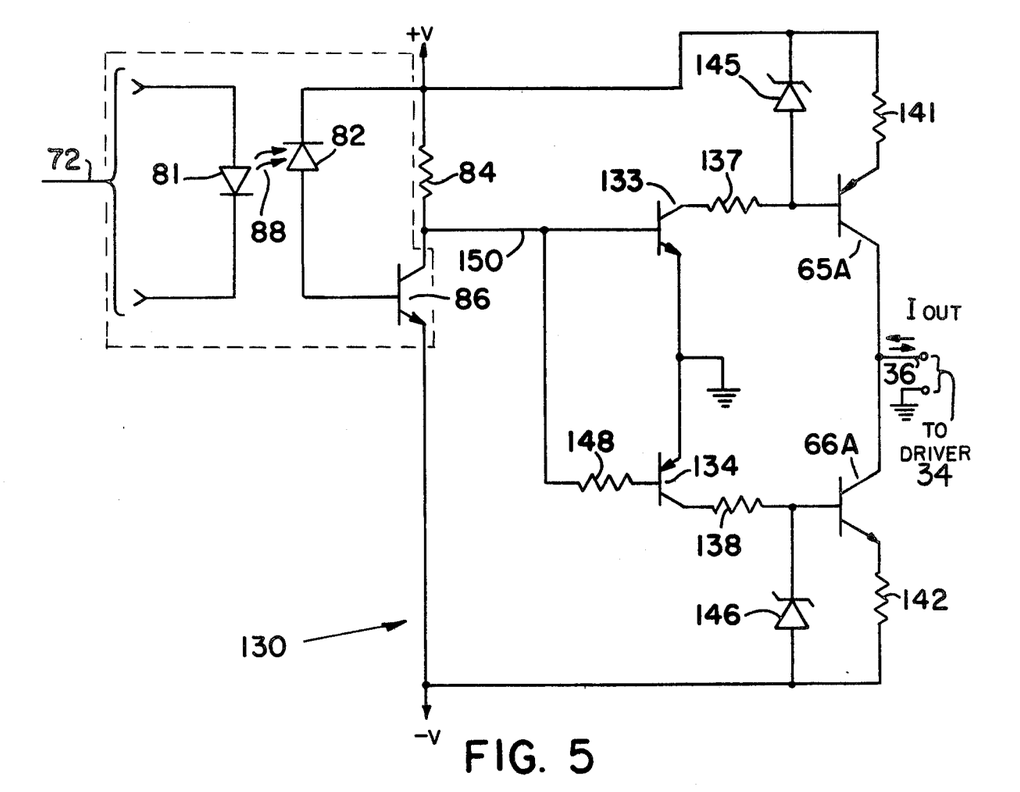
FIG. 5 is a schematic diagram of on alternative simplified circuit for activating a nonlinear driver of FIG. 1.

Referring now to FIG. 5, there is shown an alternative simplified embodiment of circuitry which may be advantageously employed for energizing the driver 34 of FIG. 1 in those situations wherein the versatility of the circuit of FIG. 1 is not required. The alternative circuit 130 of FIG. 5 replaces the series combination of the pulse shaper 54 and the transconductance amplifier 32 of FIG. 1. Thus, the circuit 130 connects between the line 72 and the input terminals of the driver 34.

The circuit 130 comprises the two photodiodes 81–82 coupled by light rays 88, the transistor 86 and the resistor 84 previously described in reference to FIG. 3. The circuit 130 further comprises a complementary output circuit for providing current on the output line 36, which circuit may employ two transistors 65A–66A which operate in a manner similar to that described with reference to the transistors 65–66 of FIG. 1.

Base current for the two transistors 65A–66A is provided by a set of two transistors 133–134 which are connected in complementary fashion with their collector terminals being coupled, respectively, by resistors 137–138 to the base terminals of the transistors 65A–66A. The connection of the transistors 65A–66A differs from the connection of the transistors 65–66 of FIG. 1 in that the collector terminals of the transistors 65A–66A are connected together and to the output line 36. Emitter current for the transistors 65A–66A is applied by resistors 141–142 coupled, respectively, to the voltages +V and −V. Zener diodes 145–146 are connected between the base terminals, respectively, of the transistors 65A–66A and the voltages +V and −V. The emitter terminals of the transistors 133–134 are connected to ground. The base terminal of the transistor 133 is coupled directly to the collector terminal of the transistor 86, while the base terminal of the transistor 134 is coupled by a resistor 148 to the collector terminal of the transistor 86.

In operation, therefore, in response to pulse signals appearing on line 72, the transistor 86 applies a pulse signal, as depicted in the graph 96 of FIG. 3, via line 150 to the base terminals of the transistors 133–134. The transistor 133 is type NPN while the transistor 134 is type PNP. Accordingly, in the presence of a positive pulse on line 150, the transistor 133 is driven into a state of conduction while the transistor 134 is driven into a state of nonconduction. Similarly, upon the presence of a negative pulse on line 150, the transistor 133 is driven into a state of nonconduction while the transistor 134 is driven into a state of conduction. The resistor 148 in the base circuit of the transistor 134 is of relatively small value, typically, 1.5 ohms, to equalize the effect of the base drive to each of the transistors, as for example, wherein the transistor 133 is type 2N3904 and the transistor 134 is type 2N3906.

In comparing the circuit of FIG. 5, with the circuit of FIG. 1, it is noted that the resistor 61 of the amplifier 32 is not present in the circuit of FIG. 5. However, current regulation is attained for each of the transistors 65A–66A, respectively, by the feedback circuit comprising resistor 141 and zener diode 145 which are coupled via the base-emitter junction of transistor 65A, and the feedback circuit comprising resistor 142 and zener diode 146 which are coupled via the base-emitter junction of transistor 66A. The resistors 141–142, each of which have a value of 2 ohms, also establish the operating point for the base emitter junction of the transistors 65A–66A.

The transistor 65A is placed in a linear state of conduction upon drawing base current via the resistor 137 by the transistor 133. Conduction of the transistor 65A terminates upon a termination in conduction of the transistor 133. Similarly, activation of the transistor 134 applies base current via the resistor 138 to the transistor 66A. The zener diodes 145–146 serve as clamping circuits to force transistors 65A–66A to remain in the linear conduction mode. The values selected for zener diodes 145–146 and the ohmic resistance chosen for resistors 141–142 dominantly determine the magnitude of the linearly regulated current on line 36 which activates the saturating driver 34. Due to the alternating linear-mode operation of transistors 65A–66A, the circuit 130 exhibits a relatively wide bandwidth and fast response time. Thereby, the circuit 130 is able to effectively activate the driver 34 of FIG. 1 for operating the load 22.

Figure 6:
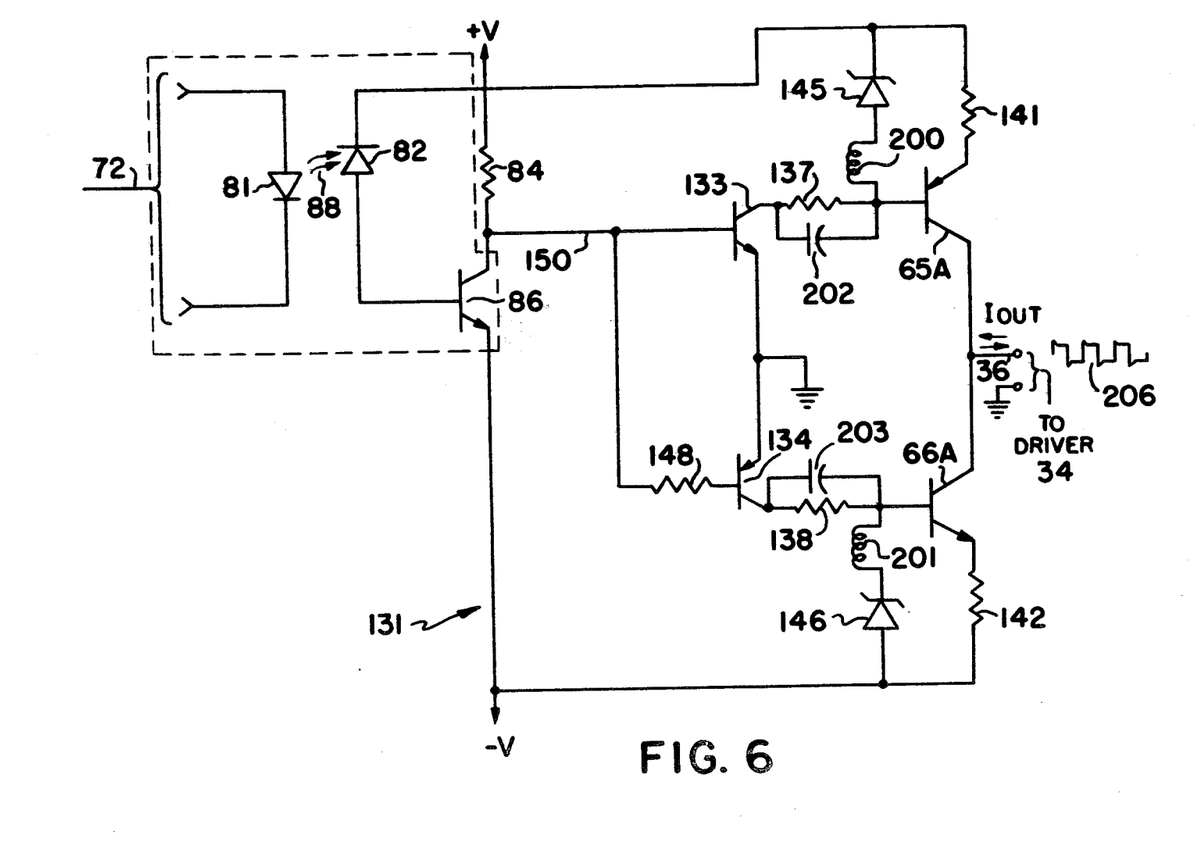
FIG. 6 is a schematic diagram showing the circuit of FIG. 5 plus additional pulse-shaping circuitry.

Referring now to FIG. 6, there is presented a circuit 131 which comprises the circuit 130 of FIG. 5 plus the inclusion of a pulse-shaping network comprising two inductors 200–201 and two capacitors 202–203. The inductors 200–201 are connected, respectively, in series with the diodes 145–146. The capacitors 202–203 are connected, respectively, in parallel with the resistors 137–138. The pulse-shaping network introduces an overshoot or spike of current at the leading and trailing edges of the pulses in the current waveform, at line 36, as portrayed in graph 206 appended to the circuit 131.

The waveform depicted in the graph 206 is advantageous in driving a load having an inductive input impedance. The magnitudes of the inductance and capacitance of the inductors 200-201 and capacitors 202-203, respectively, may be determined experimentally based on the impedance of the load 22 (FIG. 1) as reflected through the driver 34.

It is to be understood that the above-described embodiments of the invention are illustrative only and that modifications thereof may occur to those skilled in the art. Accordingly, this invention is not to be regarded as limited to the embodiments disclosed herein, but is to be limited only as defined by the appended claims.

What is claimed is:

1. A system for electrically driving a load, said system comprising:
    a linear driver;
    a nonlinear driver for applying power to said load, said nonlinear driver being driven by a current having a regulated amplitude put out by said linear driver,
    said nonlinear driver comprising means saturable to an extent dependent on the level of said amplitude,
    said linear driver comprising a linear transconductance amplifier for applying said current to said nonlinear driver so that said saturable means operates at a predetermined level of saturation, means for adjusting said amplitude of said current, and means for feeding back a portion of said current to said adjusting means, said adjusting means using said fed back current to regulate said amplitude of said current so that said saturable means operates at said predetermined level of saturation when applying power to the load.

2. A system according to claim 1 further comprising means coupled to said transconductance amplifier for pulsing said current, the amplitude of pulses of said current being equal to said regulated amplitude.

3. A system according to claim 2 wherein said saturable means includes a transistor.

4. A system according to claim 2 wherein said nonlinear driver includes a plurality of transistor circuits connected in parallel, each of said transistor circuits comprising a transistor and a resistor coupled to the emitter terminal of the transistor, the resistance of the resistor being approximately equal to the base-emitter resistance of the transistor to compensate for parameter differences among the transistors of said circuits occurring when said transistors are switched into said predetermined level of saturation by said current being applied to said transistors by said transconductance amplifier.

5. A system according to claim 3 or 4 wherein said saturable means is driven between said predetermined level of saturation and a state of current nonconduction, and thereby, the amount of said power applied to said load is controlled.

6. A system for driving a load, said system comprising:
    a driver for applying power to a load, said driver being saturable to an extent dependent on the magnitude of a drive signal applied to a terminal thereof; means for repetitively pulsing said drive signal to repetitively vary the amount of power applied by said driver, said pulsing means comprising a linear transconductance amplifier for developing sufficient power to operate said driver, said pulsing means further comprising means coupled to an input terminal of said amplifier for maintaining the amplitude of pulses of said input signal equal to a predetermined magnitude,
    said amplitude maintaining means including means for selecting a magnitude corresponding to a predetermined degree of saturation of said driver,
    said driver comprising an electrical circuit element, alternately driven by pulsation of said drive signal between said predetermined degree of saturation and a state of cut off, for applying pulses of power to said load, a state of saturation being induced in said electrical circuit element by a current supplied thereto, said drive signal being an electric current provided to said circuit element by said linear transconductance amplifier in response to a voltage signal at said input terminal of said amplifier,
    said amplifier including means for measuring the current of said drive signal, and means coupled to said measuring means for feeding back a voltage thereof which is proportional to said current for summation with said input signal.

7. A system according to claim 6 further comprising a second of said circuit elements, and wherein each of said circuit elements is a transistor, the current of said drive signal being coupled through and divided among the base-emitter junctions of respective ones of said transistors, power for said load being coupled via the collector terminals of respective ones of said transistors, each of said transistors having a resistor connected in the emitter circuit thereof for compensation of parameter differences among said transistors during a saturation thereof by said current.

8. A system for driving a load, said system comprising:
    a driver for applying power to a load, said driver being saturable to an extent dependent on the magnitude of a drive signal applied to a terminal thereof; means for repetitively pulsing said drive signal to repetitively vary the amount of power applied by said driver, said pulsing means comprising a linear transconductance amplifier for developing sufficient power to operate said driver, said pulsing means further comprising means coupled to an input terminal of said amplifier for maintaining the amplitude of pulses of said input signal equal to a predetermined magnitude,
    said amplitude maintaining means including means for selecting a magnitude corresponding to a predetermined degree of saturation of said driver,
    said driver comprising an electrical circuit element alternately driven by pulsation of said drive signal between said predetermined degree of saturation and a state of cut off for applying pulses of power to said load, a state of saturation being induced in said electrical circuit element by a current supplied thereto, said drive signal being an electric current provided to said circuit element by said linear transconductance amplifier in response to a voltage signal at said input terminal of said amplifier,
    said pulsing means comprising a source of electric pulses and a pulse width modulator for modulating the width of said electric pulses to vary the average value of power applied to said load, and means for altering the waveform of pulses of said source of pulses to include a spike waveform at the leading and trailing edges of each of said pulses.

9. A system according to claim 8 wherein said pulsing means includes a limiter for limiting the amplitude of said pulses.

10. In a pulse-width modulated system for applying power to a load, a driving circuit comprising:
- a load driver which is saturable to a predetermined degree of saturation for applying power to said load,
- means for repetitively saturating said driver to said predetermined degree of saturation, said saturating means including a linear amplifier providing an output signal having an amplitude directly proportional to an input signal of said amplifier, said output signal being coupled to an input terminal of said driver,
- said load driver including a transistor, and said amplifier being a linear transconductance amplifier providing an output current to said transistor for inducing a state of saturation therein, and
- means coupled to said amplifier for modifying the waveform of a pulse-width modulated signal of said system by the inclusion of a spike at the leading and trailing edges of each pulse of said pulse-width modulated signal.

11. A driving circuit according to claim 10 wherein said load driver includes a plurality of transistors having their base terminals coupled to the input terminal of said driver, the emitter terminals of said transistors being connected to a resistor compensation circuit for compensating said transistors for differences in their respective parameters during a saturation of said transistors, and wherein said transconductance amplifier provides a current to said input terminal of said driver for inducing states of saturation in each of said transistors.

12. A driving circuit according to claim 10 wherein said saturating means further comprises means for measuring the current of said output signal, and means coupled to said measuring means for feeding back a voltage signal proportional to said current to said linear amplifier for summation with said input signal so that said predetermined degree of saturation is maintained.

13. In a pulse width modulated system for applying power to a load, a driving circuit comprising:
- a load driver which is saturable to a predetermined degree of saturation for applying power to said load; and
- means for repetitively saturating said driver to said predetermined degree of saturation, said saturating means including a pulsing circuit providing an output current of regulated amplitude and of varying pulse duration in accordance with a pulse input signal to said saturating means, said pulsing circuit comprising a linear transconductance amplifier, said saturating means further comprising means for adjusting said amplitude of said output current, and means for feeding back a portion of said output current to said adjusting means so that said adjusting means can use said fed back current to regulate said amplitude, and thereby, maintain said predetermined degree of saturation.

14. A driving circuit according to claim 13 wherein said saturating means includes a complementary circuit of transistor means arranged for driving regulated current in alternating sense to the load driver.

15. A driving circuit according to claim 14 wherein said saturating means comprises a set of complementary circuit elements coupled so as to activate said transistor means.

* * * * *